United States Patent [19]
Baumann et al.

[11] Patent Number: 5,754,070
[45] Date of Patent: May 19, 1998

[54] METASTABLEPROOF FLIP-FLOP

[75] Inventors: D. Douglas Baumann; Madhusudan K. Chokshi, both of San Jose, Calif.

[73] Assignee: VLSI Technology, Inc., San Jose, Calif.

[21] Appl. No.: 754,507

[22] Filed: Nov. 19, 1996

[51] Int. Cl.$^6$ .................................................. H03K 3/356
[52] U.S. Cl. ........................ 327/198; 327/202; 327/213; 327/142; 326/94
[58] Field of Search ........................ 327/142, 198, 327/199, 200–203, 208, 210–212, 213–215, 218; 326/94, 16, 12; 371/22.5, 22.3; 377/79, 80

[56] References Cited

U.S. PATENT DOCUMENTS

| | | | |
|---|---|---|---|
| 4,733,405 | 3/1988 | Shimizume et al. | 377/29 |
| 4,963,772 | 10/1990 | Dike | 327/198 |
| 5,001,371 | 3/1991 | Mahabadi | 327/198 |
| 5,014,226 | 5/1991 | Horstmann et al. | 371/22.1 |
| 5,020,038 | 5/1991 | Swapp et al. | 368/120 |
| 5,440,569 | 8/1995 | Naito | 371/22.5 |
| 5,463,338 | 10/1995 | Yurash | 327/202 |
| 5,485,112 | 1/1996 | Greenberg et al. | 327/202 |

FOREIGN PATENT DOCUMENTS

| | | | |
|---|---|---|---|
| 4-220810 | 8/1992 | Japan | 327/198 |
| 6-45880 | 2/1994 | Japan | 327/198 |

OTHER PUBLICATIONS

IBM Technical Disclosure Bulletin, "Metastability Reduction in High–Speed Analog-to-Digital Converters by Alternating Latches", vol. 38, No. 7, Jul. 1995.

*Primary Examiner*—Timothy P. Callahan
*Assistant Examiner*—Eunja Shin
*Attorney, Agent, or Firm*—Douglas L. Weller

[57] ABSTRACT

A metastableproof flip-flop receives an input value on a flip-flop input. The flip-flop holds an output value on a flip-flop output. In response to a transition of a clock signal, a transition in the output value occurs. The new output value is the input value formerly received by the flip-flop. In order to make the flip-flop metastableproof, the transition in the output value is delayed when the input value is in a metastable state. When the input value is no longer in the metastable state, then the transition in the output value is allowed to complete.

12 Claims, 8 Drawing Sheets

5,754,070

METASTABLEPROOF FLIP-FLOP

BACKGROUND

The present invention concerns the design of a flip-flop and pertains particularly to the design of a flip-flop which is metastableproof.

When utilizing circuits which include flip-flops, it is generally necessary to insure against a metastable state being established within a flip-flop. A metastable state can occur, for example, when data is not synchronized with the clock signal for the flip-flop. In such a case, the data signal may be in transition between values at approximately the same time as a transition occurs in the clock signal. In this case, the voltage of the data signal may not yet be at a valid voltage level when it is captured by the flip-flop.

One solution used to avoid metastable states in a circuit is to connect several flip-flops in series. If a metastable state occurs in the first flip-flop, there is a low probability that the metastable state will propagate to a second flip-flop. Thus a metastable state in a first flip-flop will generally settle to a static state by the time the signal has propagated through one, or perhaps two more flip-flops.

One problem with the above solution is that a clock cycle is required to propagate a data signal through each flip-flop in series. This can add a significant delay to propagation of the data signal in a circuit. In addition, there is the possibility that even with the flip-flops connected in series, a metastable state could still propagate through all the flip-flops.

SUMMARY OF THE INVENTION

In accordance with the preferred embodiment of the present invention, a metastableproof flip-flop is presented. The flip-flop receives an input value on a flip-flop input. The flip-flop holds an output value on a flip-flop output. In response to a transition of a clock signal, a transition in the output value occurs. The new output value is the input value formerly received by the flip-flop. In order to make the flip-flop metastableproof, the transition in the output value is delayed when the input value is in a metastable state. When the input value is no longer in the metastable state, then the transition in the output value is allowed to complete.

In the preferred embodiment of the present invention, test circuitry is used to monitor the input value to determine when the input value is in a metastable state. When the input value is not in a metastable state, the test circuit asserts a data valid signal, which allows a delayed transition in the output value to complete.

The present invention provides a flip-flop in which no metastable state occurs. This alleviates the necessity of connecting together a series of flip-flops when data is not synchronized between a clock signal and a flip-flop.

DESCRIPTION OF THE PREFERRED EMBODIMENT

Figure 1:
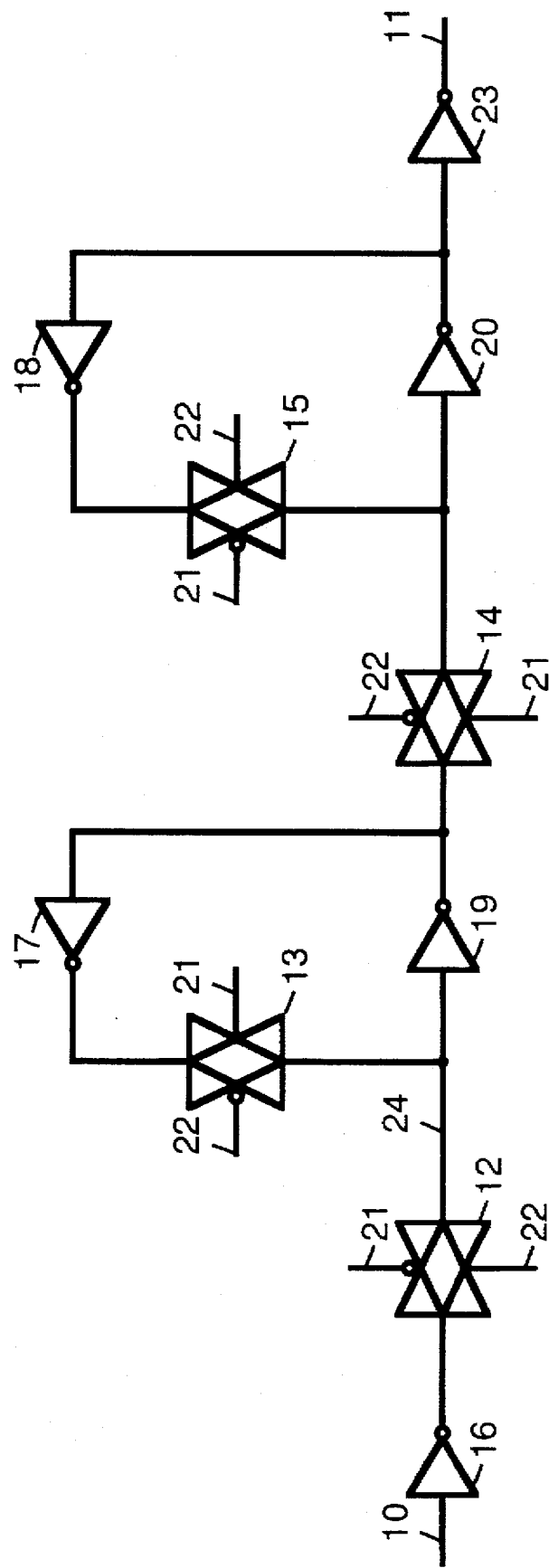
FIG. 1 shows an implementation of a flip-flop in accordance with the prior art.

FIG. 1 shows a CMOS implementation of a flip-flop in accordance with the prior art. A D input 10 of the flip-flop is used to capture a data value placed on D input 10. A Q output 11 holds a flip-flop output value. A clock signal (Clk) 21 and an inverted clock signal (!Clk) 22 are used to clock a pass gate 12, a pass gate 13, a pass gate 14 and a pass gate 15 within the flip-flop. The flip-flop additionally includes an inverter 16, an inverter 17, an inverter 18, an inverter 19, an inverter 20 and an inverter 23, connected as shown. A voltage reference node 24 is also shown.

Figure 2:
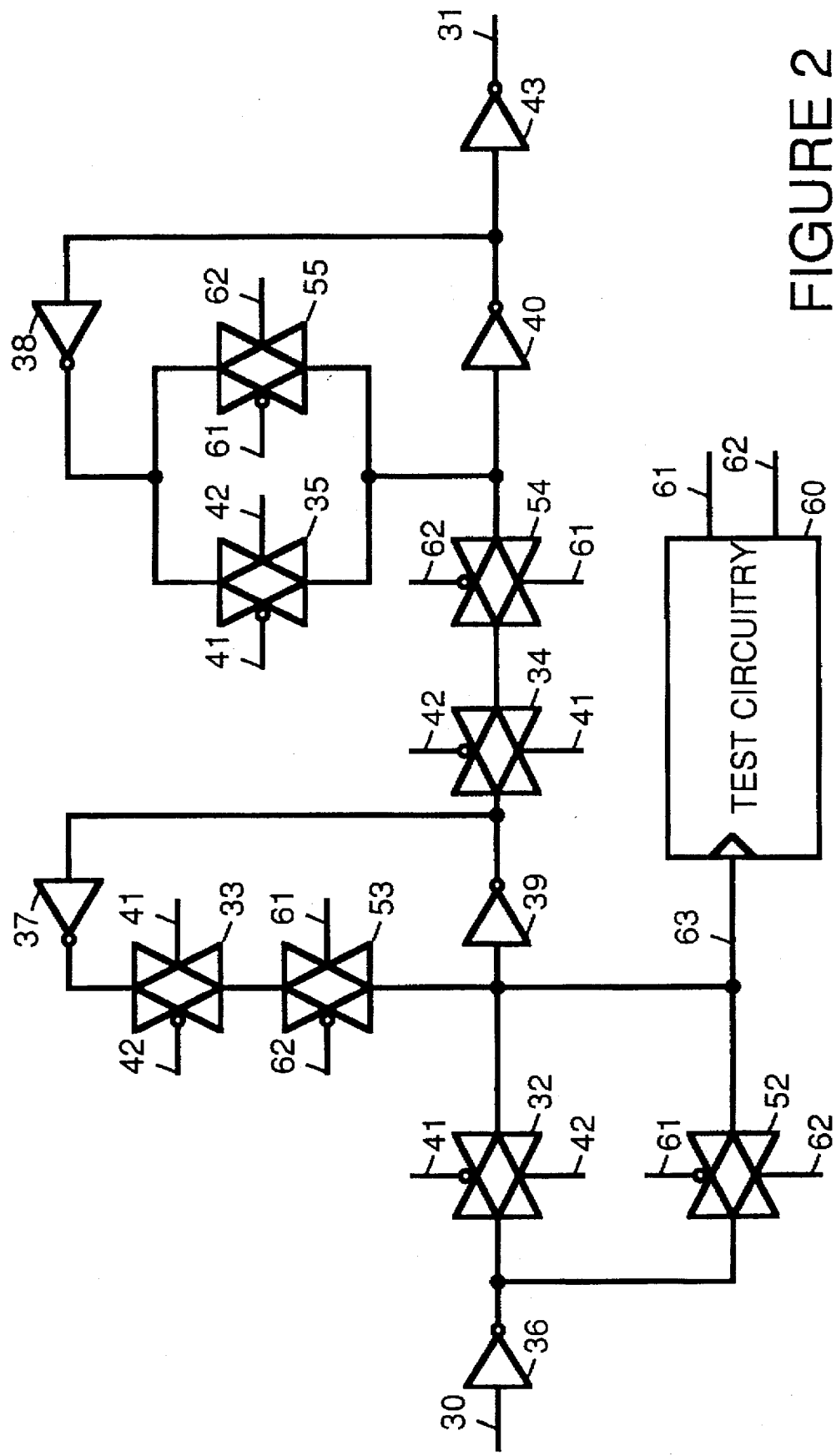
FIG. 2 shows an implementation of a metastableproof flip-flop in accordance with a preferred embodiment of the present invention.

FIG. 2 shows a CMOS implementation of a metastableproof flip-flop in accordance with a preferred embodiment of the present invention. A D input 30 of the flip-flop is used to capture a data value placed on D input 30. A Q output 31 holds a flip-flop output value. A clock signal (Clk) 41 and an inverted clock signal (!Clk) 42 are used to clock a pass gate 32, a pass gate 33, a pass gate 34 and a pass gate 35 within the flip-flop. The flip-flop additionally includes an inverter 36, an inverter 37, an inverter 38, an inverter 39, an inverter 40 and an inverter 43, connected as shown.

Test circuitry 60 within the metastableproof flip-flop generates a data valid signal on a line 61 and an inverted data valid signal on a line 62. As long as the voltage of the signal on a node 63 is invalid, e.g., between 1.5 volts and 3.5 volts, the valid signal on line 61 is deasserted (e.g., driven low) and the inverted data valid signal on line 62 is asserted (e.g., driven high).

When the voltage of the signal on node 63 is valid (e.g., less than 1.5 volts or greater than 3.5 volts), the valid signal on line 61 is asserted (e.g., driven high) and the inverted data valid signal on line 62 is deasserted (e.g., driven low).

The valid signal on line 61 and the inverted data valid signal on line 62 are used to control a pass gate 52, a pass gate 53, a pass gate 54 and a pass gate 55 within the metastableproof flip-flop. Pass gates 52 through 55 are placed in the metastableproof flip-flop to prevent the metastableproof flip-flop from latching on a value of the input signal on D input 30 when the value of the input signal on D input 30 is not at a valid voltage (e.g., is not between 1.5 volts and 3.5 volts).

Operation of the metastableproof flip-flop shown in FIG. 2 is identical to the operation of the flip-flop shown in FIG. 1 except for the case where the rising edge of clock signal (Clk) 41 occurs when the input signal on D input 30 is not at a valid voltage (e.g., is not between 1.5 volts and 3.5 volts). In this case, pass gates 52 through 55 will delay the capture of the data value on D input 30 until the input signal on D input 30 is at a valid voltage (e.g., the voltage on D input 30 is less than 1.5 volts or more than 3.5 volts). This prevents metastable states from occurring in the metastableproof flip-flop.

Figure 3:
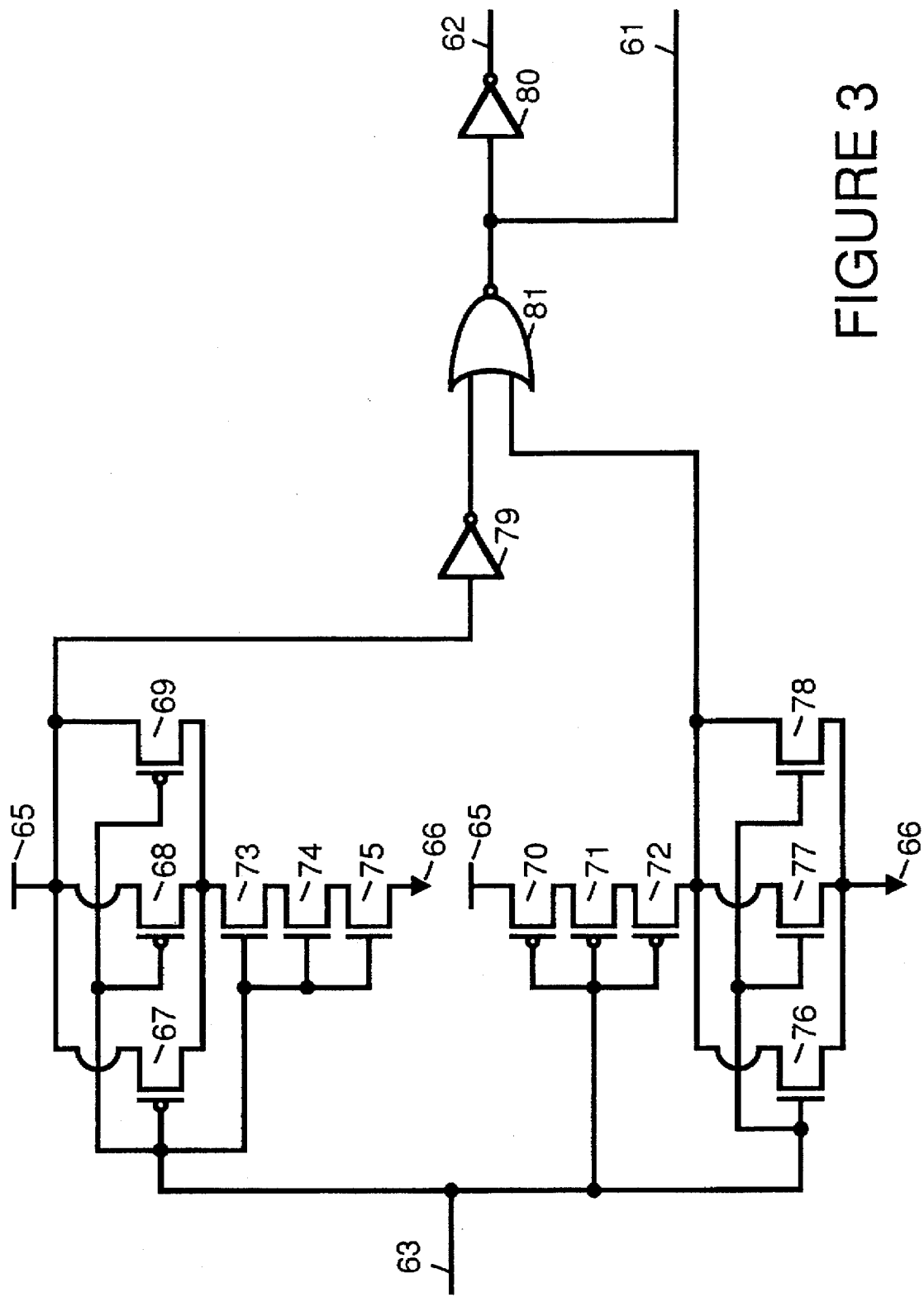
FIG. 3 shows an implementation of test circuitry within the metastableproof flip-flop shown in FIG. 2 in accordance with a preferred embodiment of the present invention.

FIG. 3 shows an implementation of test circuitry 60. A transistor 67, a transistor 68, a transistor 69, a transistor 74, a transistor 74, and a transistor 75 function together as an inverter with a threshold of 3.5 volts. A transistor 70, a transistor 71, a transistor 72, a transistor 76, a transistor 77, and a transistor 78 function together as an inverter with a threshold of 1.5 volts. Test circuitry 60 also includes an inverter 79, an inverter 80 and a logical NOR gate 81 connected as shown. Inverter 79 and inverter 80 each have a voltage threshold of, for example, 2.5 volts. A VDD signal 65 (e.g., 5 volts) and a ground signal 66 (e.g., 0 volts) are also utilized by the test circuitry.

Figure 4:
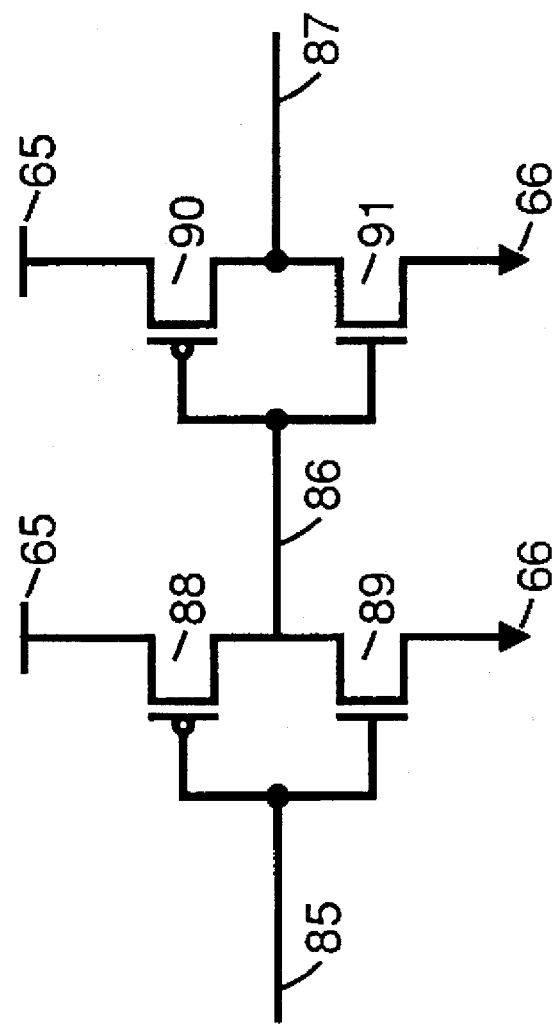
FIG. 4 shows an implementation of a clock buffer circuit in accordance with the prior art.
Figure 5:
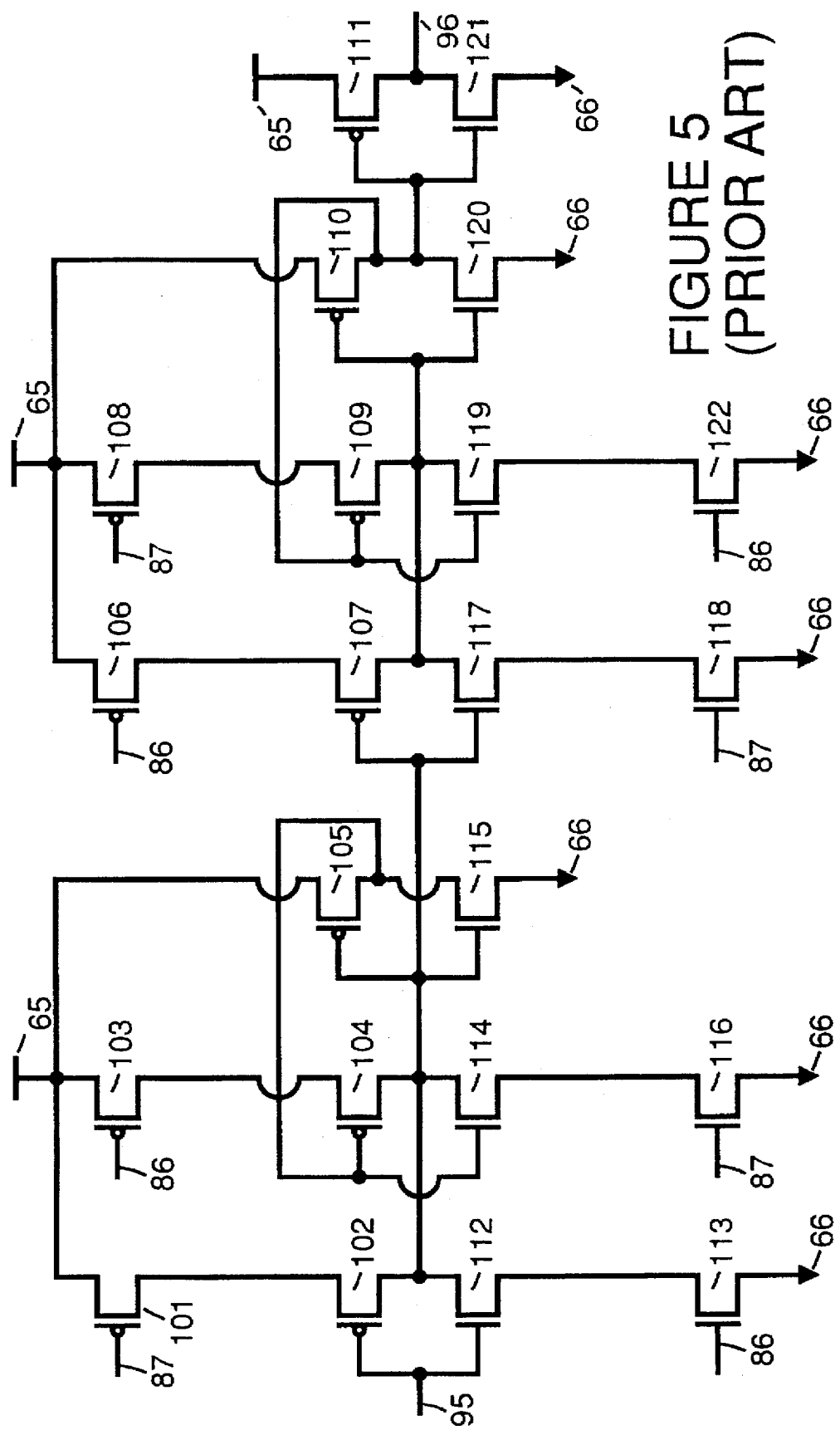
FIG. 5 shows an implementation of a flip-flop in accordance with the prior art.

FIG. 4 and FIG. 5 shows another implementation of a flip-flop, including a clock buffer circuit, as is in the prior art.

FIG. 4 shows implementation of the clock buffer. An original clock signal is placed on a line 85. A transistor 88 and a transistor 89 serve as an inverter to generate an inverted clock signal placed on a line 86. A transistor 90 and a transistor 91 serve as an inverter to generate a buffered clock signal placed on a line 87.

FIG. 5 shows the CMOS implementation of the flip-flop. A D input 95 of the flip-flop is used to capture a data value placed on D input 95. A Q output 96 holds a flip-flop output value. Each of transistor pairs 102 and 112, 104 and 114, 105 and 115, 107 and 117, 109 and 119, 110, and 120, and 111 and 121 function as an inverter. The buffered clock signal placed on line 87 is used to control a transistor 101, a transistor 108, a transistor 116 and a transistor 118. The inverted clock signal placed on line 86 are used to control a transistor 103, a transistor 106, a transistor 113 and a transistor 122.

Figure 6:
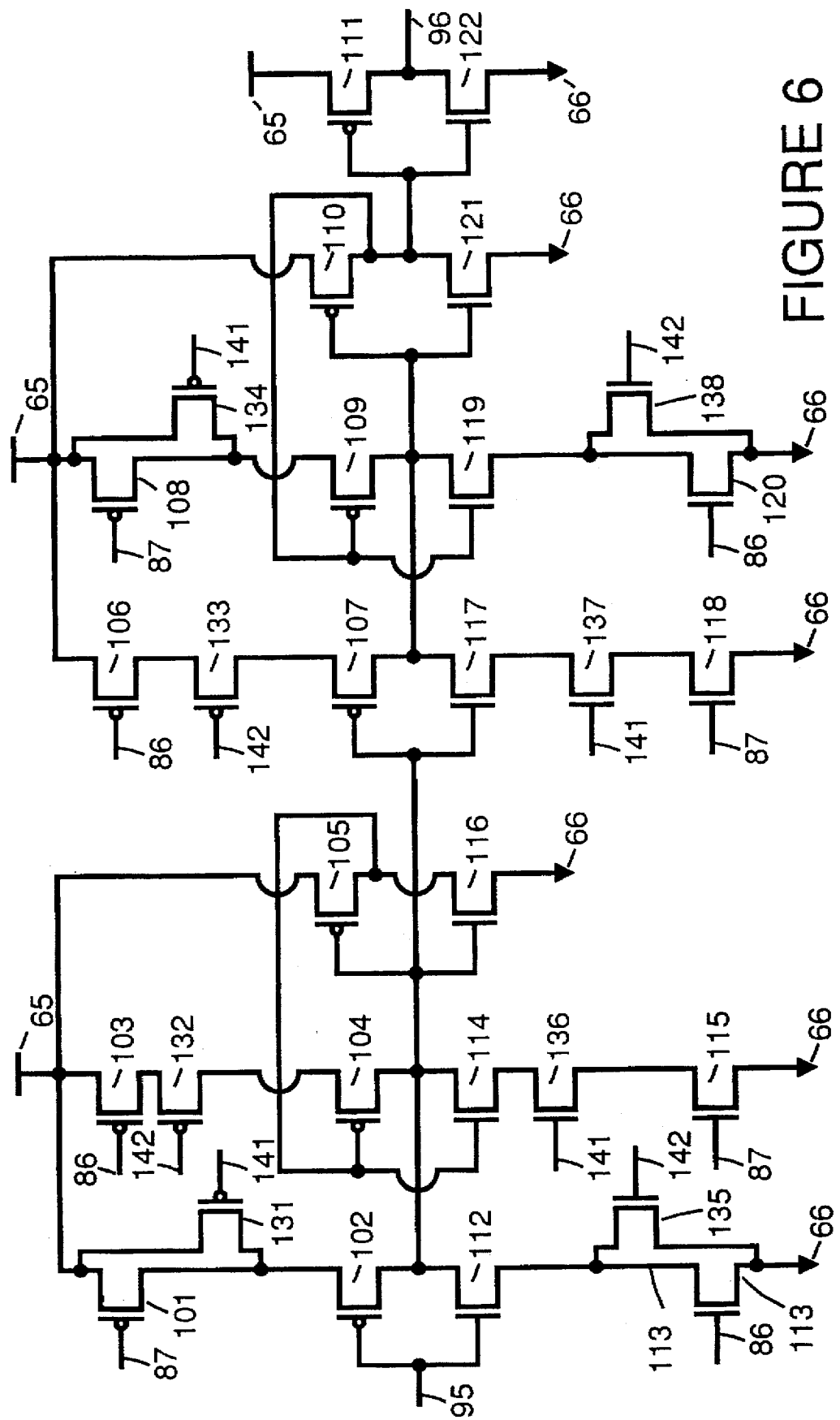
FIG. 6 shows an implementation of a metastableproof flip-flop in accordance with another preferred embodiment of the present invention.

FIG. 6 shows how the flip-flop shown in FIG. 5 can be modified to produce a metastableproof flip-flop in accordance with a preferred embodiment of the present invention. A data valid signal on a line 141 is used to control a transistor 131, a transistor 134, a transistor 136 and a transistor 137. The data valid signal after being inverted is placed on a line 142 and is used to control a transistor 132, a transistor 133, a transistor 135 and a transistor 138. Transistor 131, transistor 134, transistor 136, transistor 137, transistor 132, transistor 133, transistor 135 and transistor 138 are placed in the metastableproof flip-flop to prevent the metastableproof flip-flop from latching on a value of the input signal on D input 95 when the value of the input signal on D input 95 is not at a valid voltage (e.g., is not between 1.5 volts and 3.5 volts).

Operation of the metastableproof flip-flop shown in FIG. 6 is identical to the operation of the flip-flop shown in FIG. 5 except for the case where the rising edge of the buffered clock signal placed on line 87 occurs when the input signal on D input 95 is not at a valid voltage (e.g., is not between 1.5 volts and 3.5 volts). In this case, transistor 131, transistor 134, transistor 136, transistor 137, transistor 132, transistor 133, transistor 135 and transistor 138 will delay the capture of the data value on D input 95 until the input signal on D input 95 is at a valid voltage (e.g., the voltage on D input 30 is less than 1.5 volts or more than 3.5 volts). This prevents metastable states in the metastableproof flip-flop.

Figure 7:
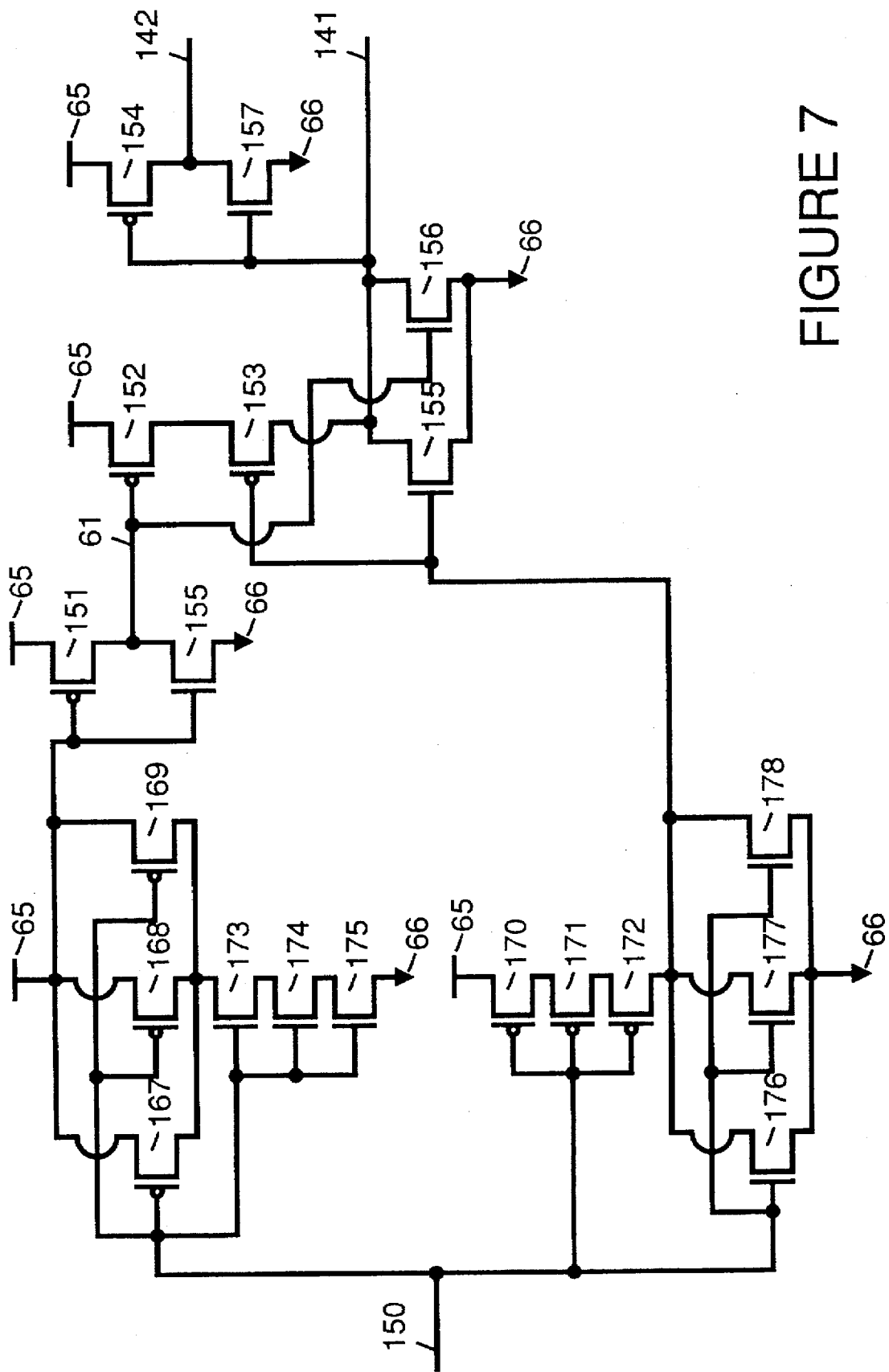
FIG. 7 shows an implementation of test circuitry within the metastableproof flip-flop shown in FIG. 6 in accordance with a preferred embodiment of the present invention.
Figure 8:
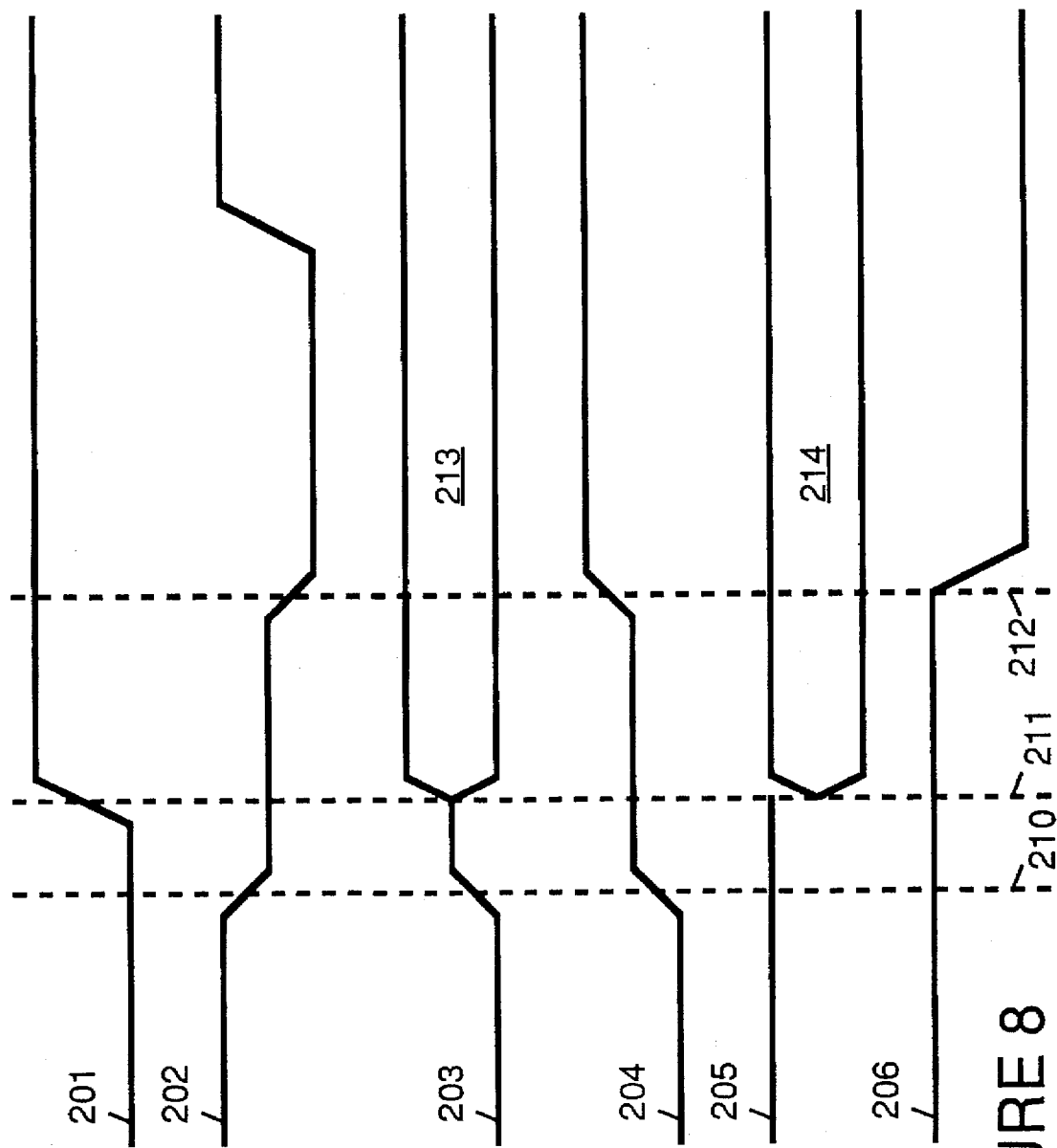
FIG. 8 is a timing diagram which illustrates operation of a preferred embodiment of the present invention.

FIG. 7 shows an implementation of test circuitry which generates the data valid signal on line 141 and the (inverted) data valid signal on line 142. A transistor 167, a transistor 168, a transistor 169, a transistor 174, a transistor 174, and a transistor 175 function together as an inverter with a threshold of 3.5 volts. A transistor 170, a transistor 171, a transistor 172, a transistor 176, a transistor 177, and a transistor 178 function together as an inverter with a threshold of 1.5 volts. Test circuitry 160 also includes a transistor pair 151 and 155 which functions as an inverter, and a transistor pair 154 and 157 which also functions as an inverter. A transistor 152, a transistor 153, a transistor 155 and a transistor 156 are connected so as to function as a logic NOR gate. FIG. 8 is a timing diagram which compares operation of a metastableproof flip-flop with a conventional flip-flop. A clock signal 201 represents a clock signal for a flip-flop, for example, clock signal (Clk) 21 of the flip-flop shown in FIG. 1 or clock signal (Clk) 41 of the metastableproof flip-flop shown in FIG. 2. A data signal 202 represents a signal on a D input of a flip-flop, for example, on D input 10 of the flip-flop shown in FIG. 1 or on D input 30 of the metastableproof flip-flop shown in FIG. 2. At a time 210, data signal 202 transitions to a voltage which is less than 3.5 volts and is greater than 1.5 volts. At a time 211, clock signal 201 transitions from a low voltage state (0 volts) to a high voltage state (5 volts). At a time 212, signal 202 transitions from the voltage which is less than 3.5 volts and is greater than 1.5 volts to a low voltage state (0 volts).

A reference node signal 203 shows a voltage of a reference node within a conventional flip-flop, for example at reference node 24 of the flip-flop shown in FIG. 1. When clock signal 201 transitions from a low voltage state (0 volts) to a high voltage state (5 volts) at time 211, data signal 202 is at a voltage which is less than 3.5 volts and is greater than 1.5 volts. The result is that the captured data value is unknown and possibly metastable, as represented by uncertain region 213.

A Q output signal 205 shows a voltage of a Q output of a conventional flip-flop, for example at Q output 11 of the flip-flop shown in FIG. 1. When clock signal 201 transitions from a low voltage state (0 volts) to a high voltage state (5 volts) at time 211, data signal 202 is at a voltage which is less than 3.5 volts and is greater than 1.5 volts and the voltage captured at reference node 24 is unknown and possibly metastable, as discussed above. When this voltage is gated to Q output 11 of the flip-flop, at time 211, the Q output signal is also unknown and possibly metastable, as represented by uncertain region 214.

A reference node signal 204 shows a voltage of a reference node within a metastableproof flip-flop, for example at node 63 of the metastableproof flip-flop shown in FIG. 2. When clock signal 201 transitions from a low voltage state (0 volts) to a high voltage state (5 volts) at time 211, pass gates 52 through 55 will delay the capture of the data value on D input 30 until the input signal on D input 30 is at a valid voltage (e.g., the voltage on D input 30 is less than 1.5 volts or more than 3.5 volts). This prevents metastable states in the metastableproof flip-flop. At time 212, when signal 202 transitions from the voltage which is less than 3.5 volts and is greater than 1.5 volts to a low voltage state (0 volts), the metastableproof flip-flop captures a valid voltage.

A Q output signal 206 shows a voltage at a Q output of a metastableproof flip-flop, for example, at Q output 31 of the metastableproof flip-flop shown in FIG. 2. When clock signal 201 transitions from a low voltage state (0 volts) to a high voltage state (5 volts) at time 211, pass gates 52 through 55 will delay the capture of the data value on D input 30 until the input signal on D input 30 is at a valid voltage (e.g., the voltage on D input 30 is less than 1.5 volts or more than 3.5 volts). As discussed above, this prevents metastable states in the metastableproof flip-flop. At time 212, when signal 202 transitions from the voltage which is less than 3.5 volts and is greater than 1.5 volts to a low voltage state (0 volts), the metastableproof flip-flop captures a valid voltage. This captured voltage is passed through, at time 212 to Q output 31, as illustrated by Q output signal 206.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A metastableproof flip-flop comprising:

a flip-flop input which receives a flip-flop input value;

a flip-flop output which provides a flip-flop output value; output hold circuitry, coupled to the flip-flop output which holds the flip-flop output value on the flip-flop output;

transition circuitry, coupled to the output hold circuitry and the flip-flop input, for, in response to a transition in a clock signal, causing a transition in the flip-flop output value so that a new flip-flop output value held by the output hold circuitry is the flip-flop input value received by the flip-flop input; and, data validation circuitry, coupled to the transition circuitry, which delays the transition of the flip-flop output value caused by the transition circuitry when the flip-flop input value is in a metastable state, the data validation circuitry preventing transition of the flip-flop output value until the flip-flop input value is no longer in the metastable state, wherein the data validation circuitry includes test circuitry which generates a data valid signal which indicates when the flip-flop input value is valid.

2. A metastableproof flip-flop as in claim 1 wherein the test circuitry includes:

a first inverter with a threshold voltage at a high end of an invalid voltage range, a second inverter with a threshold voltage at a low end of the invalid voltage range, third inverter having an input coupled to an output of the first inverter, and, a logical NOR gate, having a first input coupled to an output of the second inverter and having a second input coupled to an output of the third inverter.

3. A metastableproof flip-flop as in claim 2 wherein the threshold voltage at the high end of the invalid voltage range is approximately 3.5 volts and the threshold voltage at the low end of the invalid voltage range is approximately 1.5 volts.

4. A method for implementing a flip-flop function, comprising the following steps:

(a) receiving an input value on a flip-flop input;

(b) holding an output value on a flip-flop output; and, (c) in response to a transition of a clock signal, causing a transition in the output value so that a new output value is the input value received in step (a), including the following substep;

(c.1) delaying the transition in the output value when the input value is in a metastable state, the transition in the output value being prevented until the input value is no longer in the metastable state,including monitoring the input value by test circuitry, to determine when the input value is a metastable state, and when the input value is not in a metastable state, asserting a data valid signal by the test circuitry.

5. A metastableproof flip-flop comprising:

a first inverter, having an input and an output, the input of the first inverter functioning as a flip-flop input;

a second inverter, having an input and an output;

a third inverter, having an input and an output, the input of the third inverter being coupled to the output of the second inverter;

a fourth inverter, having an input and an output;

a fifth inverter, having an input and an output, the input of the fifth inverter being coupled to the output of the fourth inverter;

a sixth inverter, having an input and an output, the input of the sixth inverter being coupled to the output of the fourth inverter, the output of the sixth inverter functioning as a flip-flop output;

a first pass gate, coupled between the output of the first inverter and the input of the second inverter, the first pass gate being controlled by a clock signal;

a second pass gate, coupled between the output of the first inverter and the input of the second inverter, the second pass gate being controlled by a data valid signal;

a third pass gate, the third pass gate being controlled by the clock signal;

a fourth pass gate, the fourth pass gate being controlled by the data valid signal, the third pass gate and the fourth pass gate being coupled in series between the output of the third inverter and the input of the second inverter;

a fifth pass gate, the fifth pass gate being controlled by the clock signal;

a sixth pass gate, the sixth pass gate being controlled by the data valid signal, the fifth pass gate and the sixth pass gate being coupled in series between the output of the second inverter and the input of the fourth inverter;

a seventh pass gate, coupled between the output of the fifth inverter and the input of the fourth inverter, the seventh pass gate being controlled by the clock signal; and, an eighth pass gate, coupled between the output of the fifth inverter and the input of the fourth inverter, the eighth pass gate being controlled by the data valid signal;

wherein the data valid signal indicates when a voltage value on the output of the first inverter is at a valid voltage value.

6. A metastableproof flip-flop as in claim 5 additionally comprising test circuitry, coupled to the output of the first inverter, which generates the data valid signal.

7. A metastableproof flip-flop as in claim 6 wherein the test circuitry includes:

a first test circuitry inverter with a threshold voltage at a high end of an invalid voltage range;

a second test circuitry inverter with a threshold voltage at a low end of the invalid voltage range;

a third test circuitry inverter having an input coupled to an output of the first test circuitry inverter; and, a logical NOR gate, having a first input coupled to an output of the second test circuitry inverter and having a second input coupled to an output of the third test circuitry inverter.

8. A metastableproof flip-flop as in claim 7 wherein the threshold voltage at the high end of the invalid voltage range is approximately 3.5 volts and the threshold voltage at the low end of the invalid voltage range is approximately 1.5 volts.

9. A metastableproof flip-flop comprising:

a first inverter, having an input and an output, the input of the first inverter functioning as a flip-flop input;

a second inverter, having an input and an output, the output of the second inverter being coupled to the output of the first inverter;

a third inverter, having an input and an output, the input of the third inverter being coupled to the output of the second inverter, and the output of the third inverter being coupled to the input of the second inverter;

a fourth inverter, having an input and an output, the input of the fourth inverter being coupled to the input of the third inverter;

a fifth inverter, having an input and an output, the output of the fifth inverter being coupled to the output of the fourth inverter;

a sixth inverter, having an input and an output, the input of the sixth inverter being coupled to the output of the fifth inverter, and the output of the sixth inverter being coupled to the input of the fifth inverter; and, a seventh inverter, having an input and an output, the input of the seventh inverter being coupled to the output of the sixth inverter, and the output of the seventh inverter functioning as a flip-flop output;

wherein the first inverter, the second inverter, the fourth inverter and the fifth inverter are controlled by a clock signal and a data valid signal so that:

when both the clock signal is at a first clock value and the data valid signal is at a data valid value, the first inverter is inactivated, when either the clock signal is at a second clock value or the data valid signal is at a data invalid value, the second inverter is inactivated, when either the clock signal is at the second clock value or the data valid signal is at the data invalid value, the fourth inverter is inactivated, and when both the clock signal is at the first clock value and the data valid signal is at the data valid value, the fifth inverter is inactivated; and, wherein the data valid signal is at the data invalid value when a voltage value on the output of the first inverter is at an invalid voltage value.

10. A metastableproof flip-flop as in claim 9 additionally comprising test circuitry, coupled to the output of the first inverter, which generates the data valid signal.

11. A metastableproof flip-flop as in claim 10 wherein the test circuitry includes:

a first test circuitry inverter with a threshold voltage at a high end of an invalid voltage range;

a second test circuitry inverter with a threshold voltage at a low end of the invalid voltage range;

a third test circuitry inverter having an input coupled to an output of the first test circuitry inverter; and, a logical NOR gate, having a first input coupled to an output of the second test circuitry inverter and having a second input coupled to an output of the third test circuitry inverter.

12. A metastableproof flip-flop as in claim 11 wherein the threshold voltage at the high end of the invalid voltage range is approximately 3.5 volts and the threshold voltage at the low end of the invalid voltage range is approximately 1.5 volts.

* * * * *